US006358791B1

(12) United States Patent
Hsu et al.

(10) Patent No.: US 6,358,791 B1
(45) **Date of Patent: *Mar. 19, 2002**

(54) METHOD FOR INCREASING A VERY-LARGE-SCALE-INTEGRATED (VLSI) CAPACITOR SIZE ON BULK SILICON AND SILICON-ON-INSULATOR (SOI) WAFERS AND STRUCTURE FORMED THEREBY

(75) Inventors: Louis L. Hsu, Fishkill, NY (US); Li-Kong Wang, Mount Vale, NJ (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/325,731

(22) Filed: Jun. 4, 1999

(51) Int. Cl.[7] ........................................ H01L 21/8242

(52) U.S. Cl. ....................... 438/244; 438/243; 438/386; 438/287; 438/947; 438/948

(58) Field of Search ................................ 438/243, 386, 438/244, 287, 947, 949

(56) References Cited

U.S. PATENT DOCUMENTS

| | | | | |
|---|---|---|---|---|
| 4,791,610 A | | 12/1988 | Takemae | |
| 5,300,450 A | * | 4/1994 | Shen et al. | 437/52 |
| 5,658,816 A | * | 8/1997 | Rajeevakumar | 438/396 |
| 5,665,622 A | | 9/1997 | Muller et al. | |
| 5,759,907 A | | 6/1998 | Assaderaghi et al. | |
| 5,770,484 A | | 6/1998 | Kleinhenz | |
| 5,770,875 A | | 6/1998 | Assaderaghi et al. | |
| 5,843,819 A | * | 12/1998 | Kellner et al. | 438/243 |
| 6,015,731 A | * | 1/2000 | Kohyama et al. | 438/243 |
| 6,189,582 B1 | * | 2/2001 | Reinberg et al. | 143/239 |
| 6,258,655 B1 | * | 7/2001 | Basceri et al. | 438/240 |
| 6,258,658 B1 | * | 7/2001 | Bohm et al. | 438/243 |
| 6,259,135 B1 | * | 7/2001 | Hsu et al. | 257/331 |
| 6,268,620 B1 | * | 7/2001 | Ouellet et al. | 257/301 |

* cited by examiner

*Primary Examiner*—John F. Niebling
*Assistant Examiner*—Jennifer M. Kennedy
(74) *Attorney, Agent, or Firm*—Casey P. August; McGinn & Gibb, PLLC

(57) ABSTRACT

A method of forming a semiconductor device, includes forming at least one conductive island having a predetermined sidewall angle in a conductive substrate, forming a dielectric material over the at least one island, forming a conductive material over the dielectric material, and forming a contact to the conductive material and the at least one island.

19 Claims, 4 Drawing Sheets

9
W2
5
L
6
W1
W3
1B
1A
4

METHOD FOR INCREASING A VERY-LARGE-SCALE-INTEGRATED (VLSI) CAPACITOR SIZE ON BULK SILICON AND SILICON-ON-INSULATOR (SOI) WAFERS AND STRUCTURE FORMED THEREBY

BACKGROUND OF THE INVENTION

1. Field of the Invention

The present invention generally relates to a method of forming a semiconductor device, and more particularly to a method for increasing a capacitor size on bulk and silicon-on-insulator (SOI) wafers.

2. Description of the Related Art

Large capacitors are usually needed for integrated circuits such as decoupling capacitors for a power or signal bus stabilization, or capacitors for analog application circuits such as reservoirs for a charge pump. However, it is very difficult to implement a large capacitor in a chip where the chip "real estate" is already very limited.

Therefore, many methods have been proposed to increase the capacitor value without increasing the chip area. A first method is to form a deep silicon island capacitor. Making an array of deep silicon island capacitors where the capacitors are similar to those used in the DRAM used for cell node data storage. This process of making deep silicon island capacitors is very expensive, unless DRAM array is built on the same chip. However, for other chips such as SOI, or silicon-on-oxide, due to the existing buried oxide layer, if the only goal is to make a large capacitor using a deep silicon island structure, the processing and other costs will be prohibitive and thus impractical.

Another method is to include high dielectric constant material in the capacitor (e.g., between the two conductive portions or plates). This also increases the cost of processing significantly. That is, special materials and extra process steps must be employed.

Yet another method is to form a stack capacitor. However, this technique makes planarization and interconnection more difficult. Thus, this approach also is not a good option in making a large capacitor.

Other methods, such as a "roughened surface" capacitor, etc. are equally impractical and require special techniques to implement. For example, in the roughed surface approach, typically polysilicon is grown under special conditions (e.g., at a specific temperature) to form an irregular surface area (e.g., having semispherical bumps). Such semispherical bumps increase the surface area.

In another technique, for example, silicon and germanium may grow to form a rough conductive layer. This conductive layer is then conformally coated with a dielectric. This technique also increases the surface (and thus capacitance) of the structure. However, as mentioned above, such techniques are impractical and are not easily implemented. Further, the capacitance enhancement is not reproducible, and therefore not suitable especially for some analog applications where the capacitor size must be precisely controlled.

Thus, a problem arises regarding how to build large capacitors with good area control (e.g., providing a specific capacitance) on a chip, without extra process cost.

SUMMARY OF THE INVENTION

In view of the foregoing and other problems of the conventional methods and structures, an object of the present invention is to provide a method and structure in which a large capacitor can be built compatible with complementary metal oxide semiconductor (CMOS) devices on bulk or a silicon-on-insulator (SOI) wafer.

Another object is to provide a method of forming a low-cost capacitor, without any additional processing costs.

Yet another object is to use a phase-shift mask technique to increase the capacitor density to reduce pitch by patterning the sub-lithographic feature by intentionally increasing the ratio of silicon width to spacing between adjacent islands.

In a first aspect of the present invention, a method of forming a semiconductor structure, includes forming at least one conductive island having a predetermined sidewall angle in a conductive substrate, forming a dielectric material over the at least one conductive island, forming a conductive material over the dielectric material, and forming a contact to the conductive material and the at least one conductive island.

With the unique and unobvious features of the invention, a low cost method is provided to form a high performance capacitor. Further, the present invention is useful for both bulk and SOI substrates. Additionally, the technique is especially useful for SOI substrates with a thick silicon layer (e.g., having a thickness greater than 0.5 $\mu$m).

Another advantage of the invention is that large capacitors are built simultaneously with a high performance transistor or a transistor with a wrap-around gate structure.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1A:
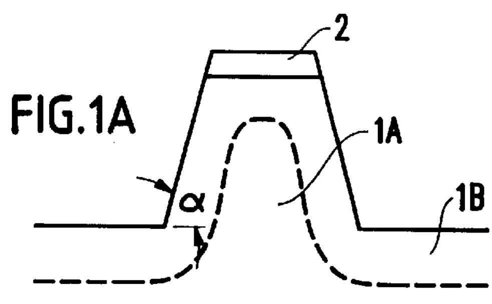
FIGS. 1A–1H illustrates a process of forming a semiconductor device on a bulk wafer according to a first preferred embodiment of the present invention.

Referring now to the drawings, and more particularly to FIGS. 1–5, there are shown preferred embodiments of the method and structures according to the present invention.

Generally, the invention is a method for forming a semiconductor device by forming at least one silicon island on a bulk silicon wafer or a silicon-on-insulator (SOI) wafer. In the exemplary process below, a capacitor is formed. The SOI wafers mentioned here have a relatively thicker silicon thickness (e.g., greater than about 5000 Å silicon thickness). The insulation layer is in the range of about 800 Å to about 3000 Å, depending upon whether the SOI substrate is formed by a wafer bonding technique or by a SIMOX process. It is noted that the insulation layer is preferably as thin as possible. However, if the insulation is too thin, then an oxide breakdown may occur and the device may become "leaky". If the insulation is too thick, then a thermal penalty of the device will result.

The wafer bonding typically results in a thicker silicon layer (e.g., in a range of about 1000 Å to about a few microns), than a SIMOX which is performed by oxygen implant (e.g., typically the silicon is in a range of about 800 Å to about 2000 Å).

Fabrication on a Bulk Silicon Wafer

Referring to FIGS. 1A–1H, a process of forming a semiconductor device (e.g., a capacitor or a wrap-around gate transistor which is performed in a similar way) will be described hereinbelow. That is, a step-by-step fabrication process of a unit capacitor or transistor block is shown from FIGS. 1A to 1H.

First, as shown in FIG. 1A, the silicon is etched to form an island with a predetermined sidewall angle $\alpha$, using a nitride as a mask. Preferably, the etch sidewall angle on the silicon island is substantially within a range of about 85 to about 88 degrees. If the sidewall angle is below the range, then a packing density of the capacitor is degraded. If the sidewall angle is above the range, then the oxide in an upper sidewall corner area may be too thin, thereby resulting in unstable device characteristics. That is, breakdown may occur. Thus, preferably an sidewall angle of 85 to 88 degrees is performed since the sidewall angle degree range is important for the capacitor body implant. However, even with a vertical sidewall angle (e.g., substantially 90 degrees), one can always use a sidewall angle implant to dope the body on the silicon sidewalls, which is well known in the art.

More specifically, in FIG. 1A, a silicon substrate (unreferenced in FIG. 1A) is etched using, for example, $Cl_2$ containing plasma, or a conventional wet etch to a proper depth with a proper sidewall angle. Again, a sidewall angle of between about 85 and about 88 degrees is preferred using patterned nitride as a masking material 2. Thereafter, a p+doping 1B is implanted into a p-type wafer 1A to form the ground plate of the capacitor. Also, at the same time, the body doping of a transistor is performed.

Figure 1B:
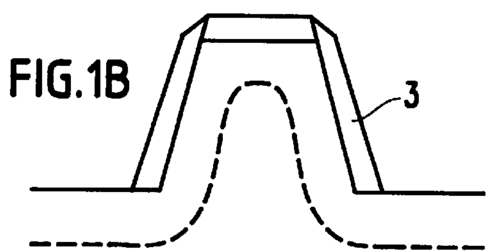

In FIG. 1B, a layer of sidewall spacer material, such as nitride, is deposited, and etched back to form sidewall spacers 3 on the sidewall of the etched silicon island. Normally, $F_2$ containing plasma can achieve a high etch selectivity to the silicon substrate.

Figure 1C:
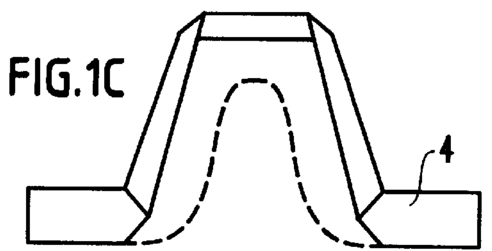

In FIG. 1C, a thermal oxide (e.g., $SiO_2$) 4 is grown on the exposed silicon surface with a proper thickness, in the range of about 500 Å to about 5000 Å.

Figure 1D:
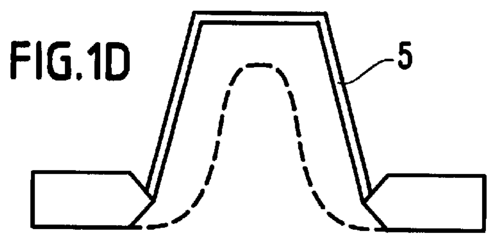

In FIG. 1D, the masking nitride 2 and the spacer nitride layer 3 are stripped, and a thinner layer 5 (e.g., within a range of about 80 Å to about 250 Å) of thermal oxide is grown. If built simultaneously with the wrap around gate transistor, this node oxide dielectric will be the same as the gate dielectric. Alternatively, a dielectric may be deposited in a thickness of about 80 Å to about 250 Å. Usually, the lower the thickness the better, so long as no reliability concerns such as pin-holes or high stress are placed on the dielectric layer. The dielectric may be formed by a material having a relatively high range (e.g., about 4 to about 50) dielectric constant, such as any one or more of a nitride, oxide, ferro-electric material, $Ta_2O_5$, a nitride, and a composite dielectric material, etc., to form node (gate) oxide 5 for the capacitor.

Figure 1E:
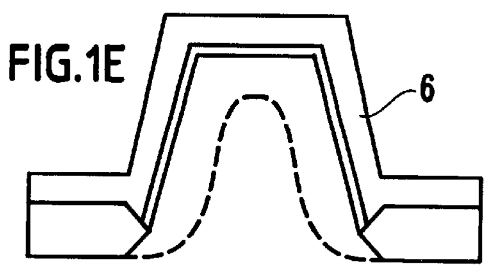

In FIG. 1E, a conductive material 6 is deposited in a thickness of about 250 Å to about 3000 Å, and more preferably about 1200 Å, to form a top plate of the capacitor. Conductive material 6 may be formed of doped polysilicon, aluminum, tungsten, suicides, copper, etc. The conductive material 6 is the node plate for the capacitor, and can also be the gate material for the transistor.

Figure 1F:
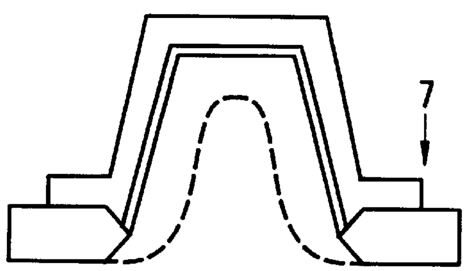

In FIG. 1F, the conductive material 6 is patterned and etched to define the node plate of the capacitor using a selective etch (e.g., such as $CF_4$ plasma) to stop at the field oxide region 7.

Figure 1G:
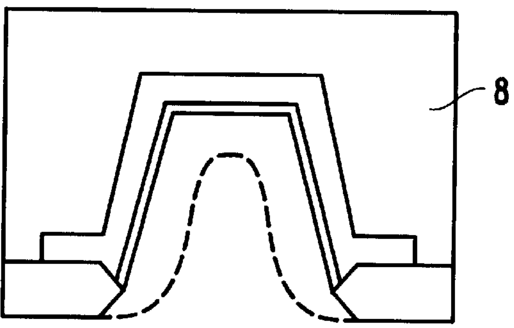

In FIG. 1G, a relatively thick dielectric 8, such as doped glass, chemical vapor deposition (CVD) oxide, TEOS, phosphor-doped glass, polyimide, etc. is deposited in a thickness of about 0.5 $\mu$m to about 2.0 $\mu$m, and more preferably about 1.0 $\mu$m. The dielectric 8 is planarized via a planarization etch, or a chemical mechanical polishing (CMP).

Figure 1H:
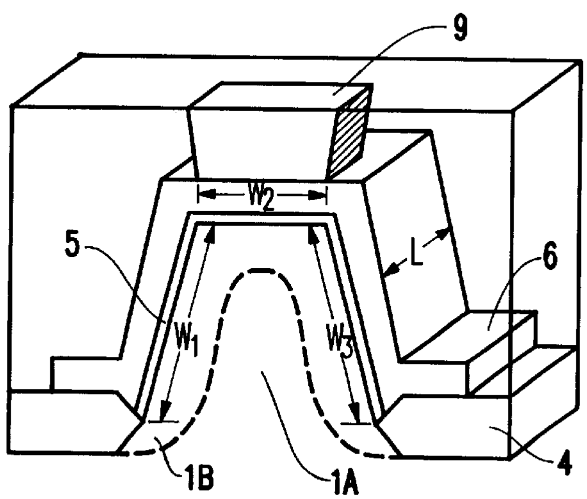

In FIG. 1H, a contact 9 is formed to reach to the node plate of the capacitor. Thus, in FIG. 1H, contact 9 is opened to the node plate and to the silicon island for diffusion contacts (not shown). FIG. 1H shows a perspective (e.g., three-dimensional) view in which the width of the capacitor is the summation of the sidewall and the top dimensions, i.e. W1+W2+W3, and the length of the capacitor is L. Therefore, the total surface area of the capacitor is L*(W1+W2+W3).

Further, FIG. 1H clearly shows that, if the structures are used to make a wrap-around gate transistor at the same time while the capacitor is made, then a wrap-around gate is formed in which the polysilicon is on three sides of the silicon island. A benefit of this structure is that not only will the width of the gate increase (e.g., W1+W2+W3), but also during the transistor operation the volume depletion will result in more gate controllability since the polysilicon is on three sides of the silicon island. Such a device is referred to as a "pseudo-SOI" device. In building such a gate, a large capacitor is formed thereby and thus is "free" in terms of requiring no additional processing steps.

Figure 2A:
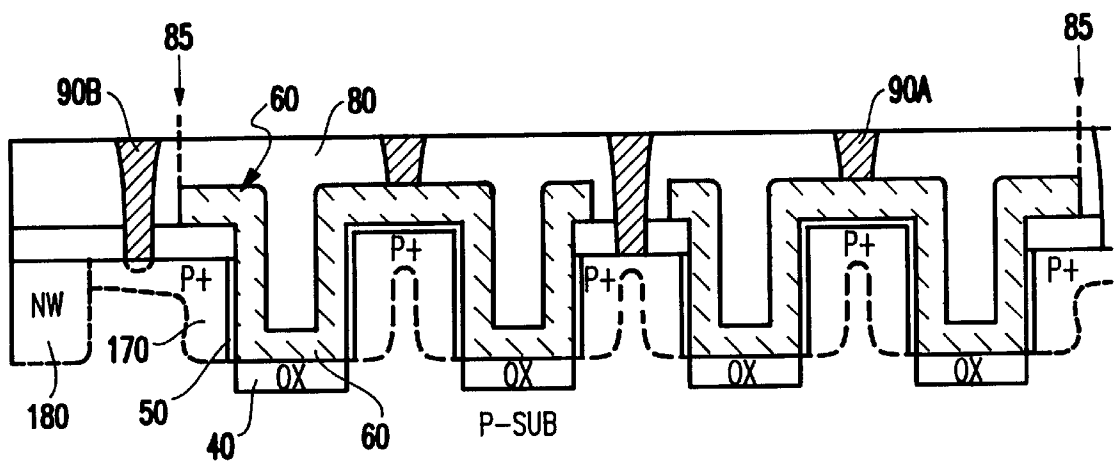
FIG. 2A illustrates a cross-section view of a finished 3-D (or 3-dimensional) device (e.g., capacitor) on a bulk silicon wafer.

FIG. 2A illustrates a cross-sectional view of the capacitor built by using the above-described unit capacitor element built in the process of FIGS. 1A–1H.

In FIG. 2A, a P+diffusion layer is made to form the ground plate 170 on a P-type substrate silicon wafer. A contact to the ground plate of the capacitor is made through contact via 90B.

A field oxide 40 is formed between each of the capacitor units. This field oxide is optional which can be replaced by the node (gate) oxide, as described above. A node oxide 50 is formed on the vertical sidewall of the etched silicon surface. The node plate of the capacitor is formed by a conductor layer 60, such as polysilicon. A contact to the node plate is made through via 90A. A contact to the n-well 180, which will be reverse-biased so as to insulate the capacitor, is not shown in the drawings.

Figure 2B:
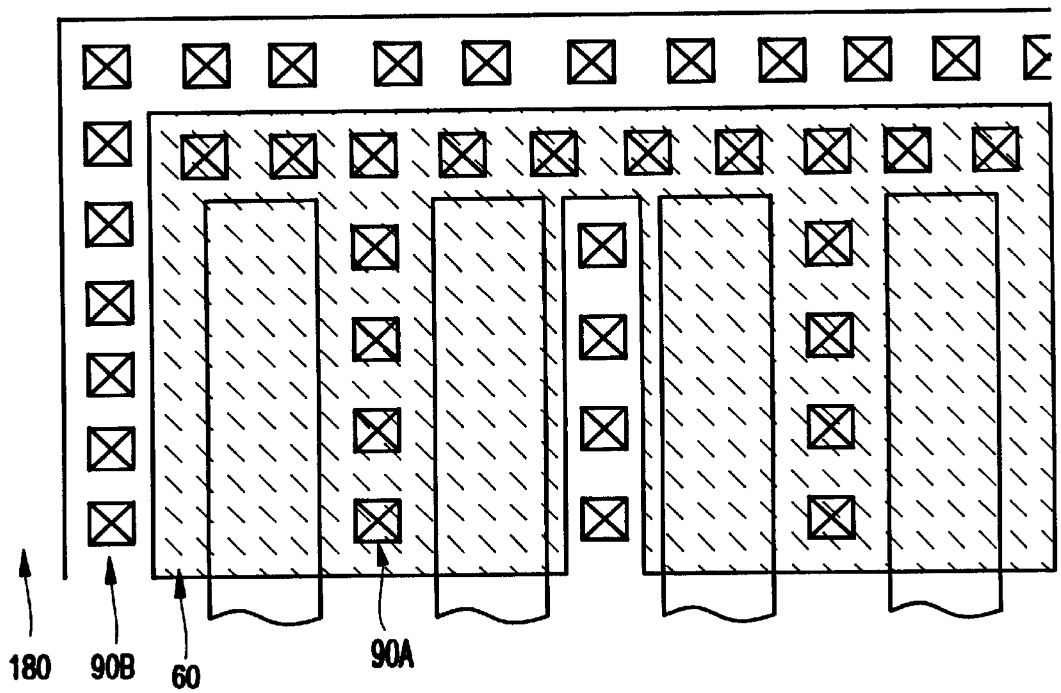
FIG. 2B illustrates a top view of the capacitor.

A top view of the cross-section of FIG. 2A is shown in FIG. 2B, in which each material and structure are shown correspondingly.

Fabrication on a SOI Wafer

Figure 3A:
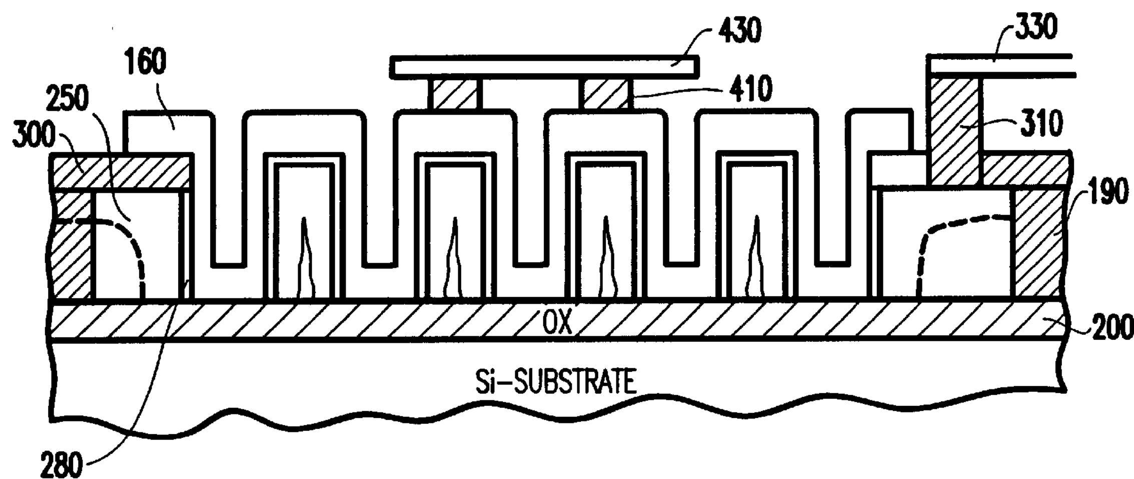
FIG. 3A illustrates a cross-sectional view of the 3-D capacitor on an SOI wafer.

A cross-sectional view of a similar capacitor built on a SOI wafer is shown in FIG. 3A. Fabricating a capacitor on a SOI wafer can be performed in a similar process to that described in FIGS. 1A–1H.

In a first step, a shallow silicon island isolation (STI) (unreferenced in FIG. 3A) is formed to define the capacitor region.

In a second step, the silicon is etched using a mask material 300, such as nitride. The etching is stopped at the buried oxide layer 200 to form a high pitch density silicon island.

Figure 4A:
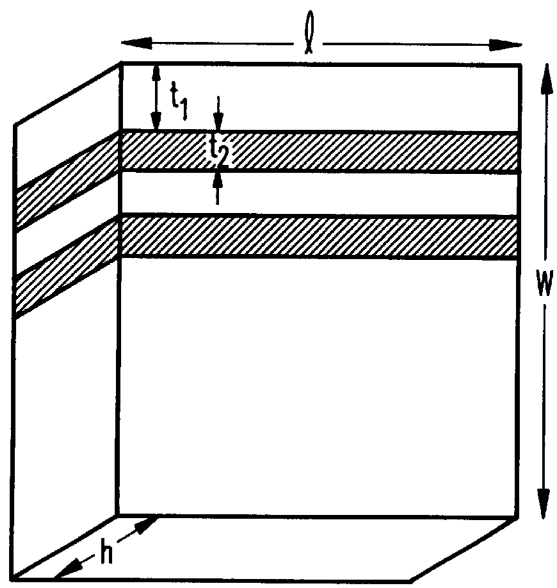
FIG. 4A illustrates how the surface area of a capacitor can be increased as the thickness of a silicon layer is increased.
Figure 4B:
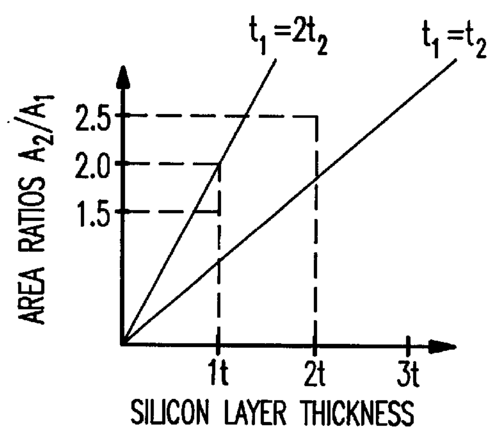
FIG. 4B is a diagram indicating the relationship between island dimensions, silicon thickness, and the increased capacitor size.
Figure 4C:
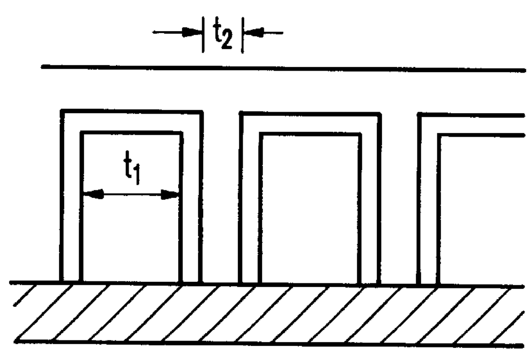
FIG. 4C illustrates a cross-section of the island structures and an exemplary relationship of t1 (e.g., island thickness) and t2 (e.g., spacing between the islands)

For example, the silicon island pitch is defined as t1+t2, where silicon island width t2 and an island-to-island distance t1, as shown in FIG. 4A. Normally, t1=t2 (the minimal patternable feature). By using a special technique, the spacing t2 can be formed smaller than the lithographic-patternable feature. Techniques such as special phase shift mask can result in a feature of the spacing size being smaller than the width of the island (e.g., t2<<t1). The final structure is shown in FIG. 4C.

In a third step, a P+dopant is implanted to form a ground plate 250. Other than a P+dopant, an N+type dopant could also be used, since the substrate is now fully isolated.

In a fourth step, a node (gate) dielectric 280 is formed on the exposed silicon surfaces. Preferably, the dielectric has a thickness of about 80 Å to about 250 Å, as mentioned above.

In a fifth step, a top plate, a conductive material 160 is deposited in a thickness of about 250 Å to about 3000 Å, and more preferably about 1200 Å, and the material 160 is etched to define the node plate material.

In a sixth step, a thick dielectric material is deposited in a thickness of about 0.5 $\mu$m to about 1.0 $\mu$m and a contact 310 and an interconnect 330 to the ground plate and contact 410 and interconnect 430 to the node plate.

Figure 3B:
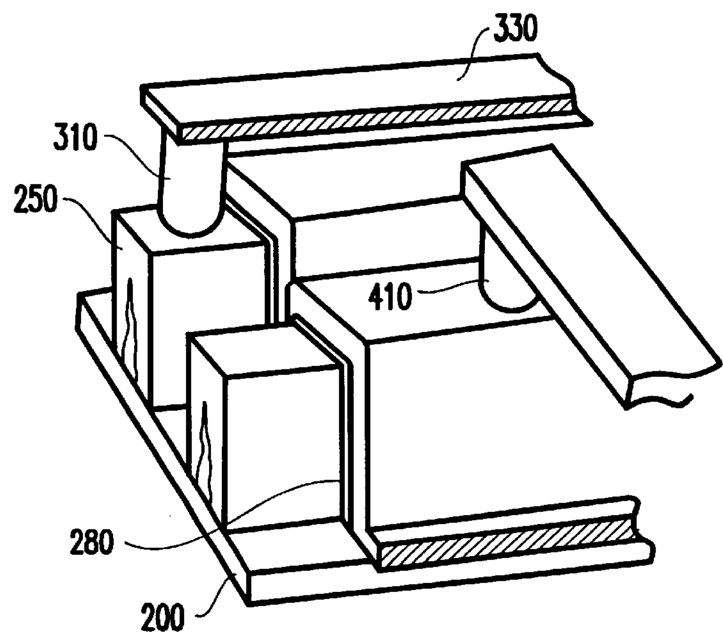
FIG. 3B illustrates a perspective view of the SOI capacitor of FIG. 3A.

A perspective (e.g., a 3-D) view of the capacitor built on the SOI wafer is shown in FIG. 3B.

FIG. 4A indicates how the surface area of a capacitor can be increased as the thickness of the silicon layer h is increased. This capability also is evident from the equations below. For example, if the thickness of the silicon layer of the SOI wafer is the same as the pitch dimension (width+distance (t1+t2≅2t), then the surface area will be 2.5 times more than a planar capacitor. Here, t is the minimal lithographic patternable feature. However, if a phase shift mask or other sub-lithographic technique is used, then t2 can be patterned substantially smaller than t1, and more capacitance could be obtained, as shown in FIG. 4B. For example, for the line t1=2t2, for the same silicon thickness, h, the area ratio ($A_2/A_1$) is increased; here $A_1$=planar surface area (e.g., l×w) and $A_2$=total capacitor surface area.

To avoid etching polysilicon at the valley (trough) of the islands, the polysilicon is intentionally cut at the top of the silicon island. As shown in reference numeral 85 of FIG. 2A, a polysilicon plate is defined by a reactive ion etching (RIE), and the cutting position is located at the top of the silicon island. Therefore, the problems associated with RIE, such as leaving a residual material on the silicon sidewalls and others, can be avoided.

The top view and the cross-sectional views of forming such a large capacitor on a bulk silicon wafer are shown in FIGS. 2B and 2A, respectively. It is noted that a contact depth to the polysilicon plate (or node plate) and to the diffusion plate (or the ground plate) are different.

Specifically, the depth of the contact to the polysilicon node plate may be in the range of about 3500 Å to about 5000 Å, whereas the depth of the contact to the diffusion plate may be in the range of about 5000 Å to about 6000 Å. Therefore, a selective etch is used with a high etch rate ratio between oxide to silicon or polysilicon ratio is about 20:1. This process is also well known in the art.

For an SOI wafer, the process would be simpler, because the depth is defined by the SOI silicon layer thickness.

For a thin SOI wafer (e.g., having a thickness below about 3000 Å), a processing via SIMOX may not be appropriate to adapt this method, because the increased area is not significant.

For a thicker SOI (e.g., having a silicon thickness of about 500 nm to about 2.0 $\mu$m) formed by wafer bonding, this method will be very attractive because the increase capacitor size is significant as shown in the chart of FIG. 4B.

In FIG. 3A, a cross-sectional view of the capacitor on an SOI wafer is shown. For a unit surface area, the increased capacitor area is a function of the silicon material thickness, or "h", if the island width and the island-to-island space dimension are both "t".

In FIG. 4A, the increased capacitor area becomes significant as the "h" is increased. For example, for t=0.5 $\mu$m, and h=1.5 $\mu$m, then the capacitor area would be increased by about 3.5 times. As evident from FIG. 4A, the following relationships apply:

$$A_1 = l \cdot w \text{(the planar surface area)};$$

$$\text{pitch} = (t\mathbf{1} + t\mathbf{2});$$

$$\# \text{ of islands} = w/(t\mathbf{1} + t\mathbf{2}) = n;$$

and $$A_2 = (2h + t\mathbf{1}) \times n \times l; \text{(total capacitor area)}.$$

Let t1=t2=t=minimal lithographic dimension $$\text{then} A_2 = (2h + t/\mathbf{2}t) l \cdot w;$$

and $$(A_2/A_1) = (2h + t)(\mathbf{2}t) \text{(the area ratio)}.$$

FIG. 4B illustrates that thicker SOI is advantageous with the present invention.

FIG. 4C illustrates a cross-section of the island structures and an exemplary relationship of t1 (e.g., island thickness) and t2 (e.g., spacing between the islands). It is noted that, for example, with t1 being 0.15 micron patterned by a DUV lithographic technique, then t2 is 0.08 micron, and can be formed in a sub-lithographic technique in which a special phase shift mask is employed.

Figure 5:
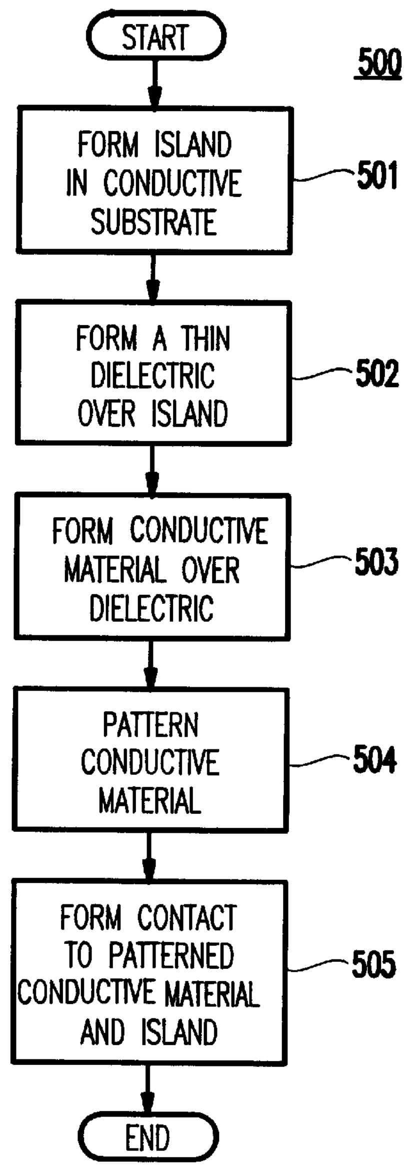
FIG. 5 illustrates a flowchart of the inventive method.

FIG. 5 illustrates a flowchart of the method 500 of the invention which can be applied to either bulk silicon wafers or SOI wafers.

Specifically, in step 501, at least one conductive island is formed in a conductive substrate, as described above. In step 502, a dielectric material is formed (e.g., grown or deposited) over the island(s).

In step 503, a conductive material is formed over the dielectric material. In step 504, the conductive material is patterned, and finally in step 505, a contact is formed to the patterned conductive material to the island(s).

Thus, with the invention, a method is provided for forming a semiconductor device (e.g., a large capacitor) on a bulk or a thicker SOI wafer with minimal chip area without using extra process steps.

While the invention has been described in terms of several preferred embodiments, those skilled in the art will recognize that the invention can be practiced with modification within the spirit and scope of the appended claims.

For example, other devices besides capacitors would find great benefit with the invention. Specifically, the present invention can be advantageously applied to fabricating high performance transistors to increase a channel width thereof.

What is claimed is:

1. A method of forming a semiconductor capacitor, comprising:

forming at least one conductive island having a sidewall angle in a conductive substrate;

forming a dielectric material over said at least one conductive island, so as to cover said at least one conductive island with said dielectric material;

forming a conductive material over said dielectric material; and forming a first contact to said conductive material and a second contact to said at least one conductive island, wherein said semiconductor capacitor is formed on a surface of said at least one conductive island.

2. The method according to claim 1, wherein said conductive substrate comprises a bulk silicon substrate.

3. The method according to claim 1, wherein said conductive substrate comprises a silicon-on-insulator (SOI) substrate.

4. The method according to claim 2, wherein said forming said dielectric material comprises:

growing a field oxide on an exposed surface of said bulk silicon wafer; and growing a node oxide over said at least one conductive island.

5. The method according to claim 1, further comprising:

forming a sidewall spacer on said at least one conductive island, wherein said conductive substrate comprises a bulk silicon substrate.

6. The method according to claim 1, wherein said forming of said dielectric material comprises depositing said dielectric material.

7. The method according to claim 1, wherein said forming of said dielectric material comprises growing said dielectric material.

8. The method according to claim 1, wherein said dielectric material comprises a dielectric having a dielectric constant between about 4 and about 50.

9. The method according to claim 8, wherein said dielectric material comprises at least one of a ferroelectric film, $Ta_2O_5$, a nitride, and a composite dielectric material.

10. The method according to claim 1, further comprising:

patterning said conductive material formed over said dielectric material.

11. The method according to claim 10, further comprising:

patterning the conductive material located at a top portion of the conductive island.

12. The method according to claim 2, wherein said forming of said dielectric material comprises:

forming a sidewall spacer on said at least one conductive island;

forming an oxide on an exposed surface of said bulk silicon wafer;

forming a node oxide over said at least one conductive island; and removing said sidewall spacer, prior to forming said dielectric material over said at least one conductive island.

13. The method according to claim 3, wherein said SOI wafer includes a silicon layer and an oxide layer, said method further comprising:

etching said silicon layer to reach the oxide layer, said oxide layer being a buried oxide layer.

14. The method according to claim 1, wherein said dielectric material includes at least one of thermal oxide and chemical vapor deposition nitride.

15. The method according to claim 1, wherein said conductive material includes at least one of doped polysilicon, aluminum, tungsten, and copper.

16. The method according to claim 3, wherein said SOI silicon thickness is greater than 3000 Å.

17. The method according to claim 1, wherein a space between each of said at least one conductive island is made to have a sub-lithographic dimension such that a packing density of said semiconductor capacitor is increased.

18. A method of forming a semiconductor capacitor sub-lithographic pattern, comprising:

using a phase shift mask, forming a plurality of conductive islands having a sidewall angle in a conductive substrate, said islands each being a solid structure of conductive material surrounded by an ambient;

forming a dielectric material over said islands so as to cover said islands with said dielectric material;

forming a conductive material over said dielectric material; and forming a contact to said conductive material and said conductive islands, wherein a spacing size between adjacent islands is smaller than a width of an island, wherein said semiconductor capacitor is formed on a surface of said islands.

19. The method according to claim 18, wherein said spacing is formed smaller than a minimum lithographically patternable feature.

* * * * *